United States Patent [19]

Kwon

[11] Patent Number: 5,414,379

[45] Date of Patent: May 9, 1995

[54] OUTPUT BUFFER CIRCUIT FOR INTEGRATED CIRCUIT

[75] Inventor: Geoun T. Kwon, Bubaleub, Rep. of Korea

[73] Assignee: Hyundai Electronics Industries Co., Ltd., Kyoungkido, Rep. of Korea

[21] Appl. No.: 174,384

[22] Filed: Dec. 27, 1993

[30] Foreign Application Priority Data

Dec. 30, 1992 [KR] Rep. of Korea ............... 1992-26866

[51] Int. Cl.$^6$ .................. H03K 5/12; H03K 17/16
[52] U.S. Cl. .................. 327/170; 327/380; 327/389; 326/27; 326/57
[58] Field of Search ............. 307/572, 585, 263, 270, 307/451, 443, 473, 571

[56] References Cited

U.S. PATENT DOCUMENTS

| | | | |
|---|---|---|---|
| 4,877,978 | 10/1989 | Platt | 307/473 |
| 5,013,940 | 5/1991 | Ansel | 307/443 |
| 5,214,320 | 5/1993 | Truong | 307/263 |
| 5,315,172 | 5/1994 | Reddy | 307/451 |
| 5,315,173 | 5/1994 | Lee et al. | 307/263 |

*Primary Examiner*—Timothy P. Callahan
*Assistant Examiner*—Toan Tran
*Attorney, Agent, or Firm*—Darby & Darby

[57] ABSTRACT

An output buffer circuit for an integrated circuit comprising first and second NAND gates and first and second output drive transistors. The first NAND gate inputs a first input signal and a first control signal and the second NAND gate inputs a second input signal and the first control signal. Also, the output buffer circuit comprises a first inversion part for inverting an output signal from the first NAND gate in response to the first control signal and a second control signal, a second inversion part for inverting an output signal from the second NAND gate in response to the first and second control signals, a third transistor having a gate connected to a third control signal, a fourth transistor having a source connected to the third transistor and a gate and a drain connected in common to an output terminal of the first NAND gate, a fifth transistor having a source connected to a ground voltage and a gate connected to a fourth control signal, a sixth transistor having a gate connected to the third control signal, a seventh transistor having a source connected to the sixth transistor and a gate and a drain connected in common to an output terminal of the second NAND gate, and an eighth transistor having a source connected to the ground voltage and a gate connected to the fourth control signal.

4 Claims, 3 Drawing Sheets

OUTPUT BUFFER CIRCUIT FOR INTEGRATED CIRCUIT

BACKGROUND OF THE INVENTION

1. Field of the Invention

The present invention relates in general to output buffer circuits for integrated circuits, and more particularly to an output buffer circuit for an integrated circuit in which an amount of maximum instantaneous current is reduced and an access time is thus enhanced.

2. Description of the Prior Art

Generally, output buffer circuits act to transfer signals in integrated circuits to other circuits in the outside of the integrated circuits. The output buffer circuits are generally used in semi-conductor memory devices such as a dynamic random access memory (DRAM), a static random access memory (SRAM), a mask read only memory (ROM) and etc. Such an output buffer circuit is shown in FIG. 1, herein.

Referring to FIG. 1, there is shown a circuit diagram of a conventional output buffer circuit. As shown in this drawing, a control signal Φ1 is used to control an output signal of the output buffer circuit. Also, two input signals S1 and S2 of the opposite phases are applied to the output buffer circuit.

In the case where the control signal Φ1 is "high", the input signal S1 is full-swung to a power source voltage level Vcc through a NAND gate ND1 and an inverter G1. Also, the input signal S2 is full-swung to the power source voltage level Vcc through a NAND gate ND2 and an inverter G2. As a result, a transistor Q1 is turned on/off by the input signal S1 and a transistor Q1' is turned on/off by the input signal S2.

On the contrary, if the control signal Φ1 is "low", the input signals S1 and S2 are not applied respectively to the transistors Q1 and Q1', resulting in having no effect on the output signal of the output buffer circuit. In this case, the output signal of the output buffer circuit remains at its state just before the control signal Φ1 goes low.

However, the conventional output buffer circuit has a disadvantage in that a large amount of maximum instantaneous current flows upon phase-inversion of the output signal, resulting in generation of a noise. The generation of the noise results in a delay in a data access time. As a result, a circuit performance is degraded.

SUMMARY OF THE INVENTION

Therefore, the present invention has been made in view of the above problems, and it is an object of the present invention to provide an output buffer circuit for an integrated circuit in which an output voltage becomes an intermediate level before it is inverted in phase, so that an amount of maximum instantaneous current can be reduced and an access time thus be enhanced.

In accordance with one aspect of the present invention, there is provided an output buffer circuit for an integrated circuit comprising first and second NANDing means, said first NANDing means having a first input terminal for inputting a first input signal and a second input terminal for inputting a first control signal, said second NANDing means having a first input terminal for inputting a second input signal and a second input terminal for inputting said first control signal, said first and second input signals having the opposite phases, and first and second output drive transistors, wherein the improvement comprises first inversion means connected to an output terminal of said first NANDing means for inverting an output signal from said first NANDing means in response to said first control signal and a second control signal, said second control signal being an inverted one of said first control signal; second inversion means connected to an output terminal of said second NANDing means for inverting an output signal from said second NANDing means in response to said first and second control signals; a third transistor connected to a first node, said first node connecting said first inversion means to said first output drive transistor, said third transistor having a gate connected to a third control signal, said third control signal going "high" under the condition that said first control signal is "low", to cause the output signal from said first NANDing means to become "low"; a fourth transistor having a source connected to said third transistor and a gate and a drain connected in common to the output terminal of said first NANDing means; a fifth transistor having a drain connected to said first node, a source connected to a ground voltage and a gate connected to a fourth control signal, said fourth control signal going "high" earlier than said third control signal under the condition that said first control signal is "low", to cause output signals from said first and second inversion means to become "low"; a sixth transistor connected to a second node, said second node connecting said second inversion means to said second output drive transistor, said sixth transistor having a gate connected to said third control signal; a seventh transistor having a source connected to said sixth transistor and a gate and a drain connected in common to the output terminal of said second NANDing means; and an eighth transistor having a drain connected to said second node, a source connected to the ground voltage and a gate connected to said fourth control signal.

In accordance with another aspect of the present invention, there is provided an output buffer circuit for an integrated circuit comprising first and second NANDing means, said first NANDing means having a first input terminal for inputting a first input signal and a second input terminal for inputting a first control signal, said second NANDing means having a first input terminal for inputting a second input signal and a second input terminal for inputting said first control signal, said first and second input signals having the opposite phases, and first and second output drive transistors, wherein the improvement comprises: first inversion means connected to an output terminal of said first NANDing means for inverting an output signal from said first NANDing means in response to said first control signal and a second control signal, said second control signal being an inverted one of said first control signal; second inversion means connected to an output terminal of said second NANDing means for inverting an output signal from said second NANDing means in response to said first and second control signals; a third transistor connected to a first node, said first node connecting said first inversion means to said first output drive transistor, said third transistor having a gate connected to a third control signal, said third control signal going "high" under the condition that said first control signal is "low", to cause the output signal from said first NANDing means to become "low"; a fourth transistor having a source connected to said third transistor and a gate and a drain connected in common to the output terminal of said first NANDing means; a fifth transistor having a drain connected to said first node, a source connected to a gate of said second output drive transistor and a gate connected to a fourth control signal, said fourth control signal going "high" earlier than said third control signal under the condition that said first control signal is "low", to cause output signals from said first and second inversion means to become "low"; a sixth transistor connected to a second node, said second node connecting said second inversion means to said second output drive transistor, said sixth transistor having a gate connected to said third control signal; and a seventh transistor having a source connected to said sixth transistor and a gate and a drain connected in common to the output terminal of said second NANDing means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
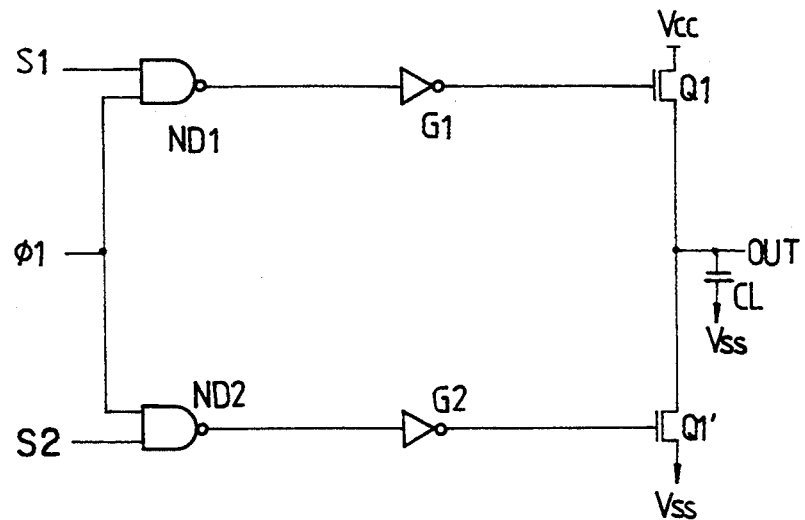
FIG. 1 is a circuit diagram of a conventional output buffer circuit.
Figure 2:
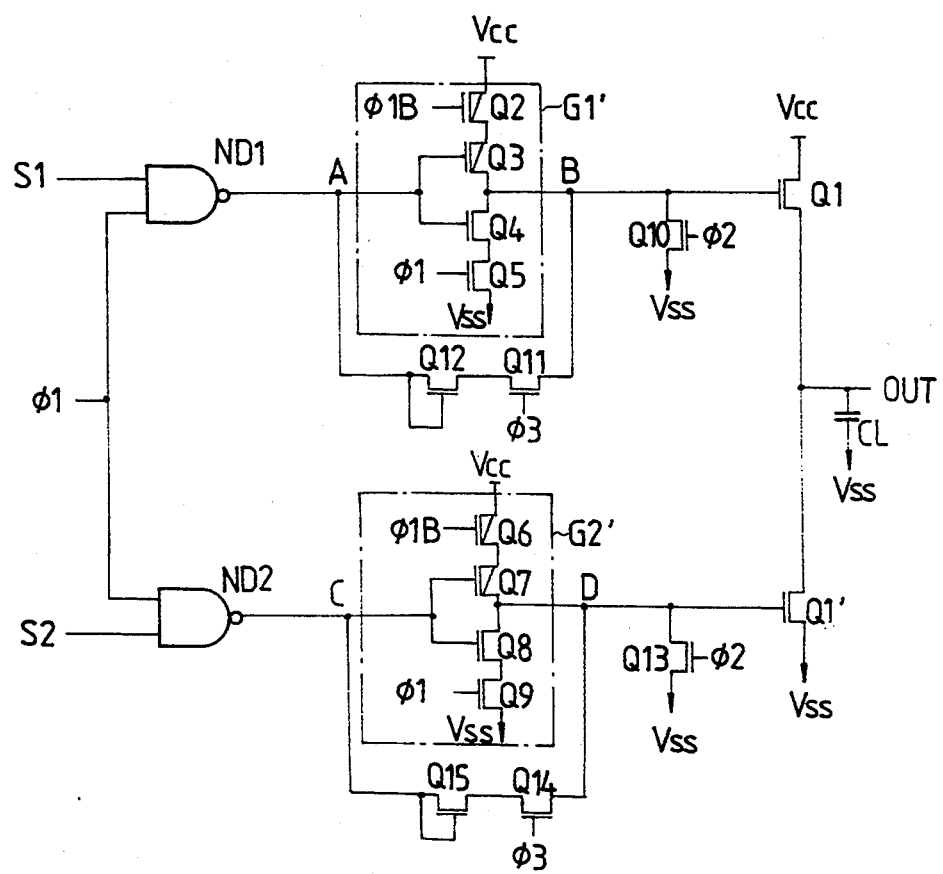
FIG. 2 is a circuit diagram of an output buffer circuit in accordance with an embodiment of the present invention.

Referring to FIG. 2, there is shown a circuit diagram of an output buffer circuit in accordance with an embodiment of the present invention. Some of parts in this drawing are the same as those in FIG. 1. Therefore, like reference numerals designate like parts.

As shown in FIG. 2, the output buffer circuit comprises inversion means G1' and G2' instead of the inverters G1 and G2 in FIG. 1. The inversion means G1' includes a plurality of MOS transistors Q2-QS. The inversion means G2' includes a plurality of MOS transistors Q6-Q9. In response to the control signal Φ1 and an inverted one Φ1B of the control signal Φ1, the inversion means G1' and G2' are operated only when the control signal Φ1 is "high".

Also, the output buffer circuit comprises a plurality of MOS transistors Q10-Q12 and Q13-Q15 in addition to the construction of FIG. 1, so as to prevent generation of a noise resulting from a large amount of maximum instantaneous current.

In detail, the 2-input NAND gate ND1 is adapted to combine the input signal S1 and the control signal Φ1. The 2-input NAND gate ND2 is adapted to combine the input signal S2 and the control signal Φ2 of the opposite phase to that of the input signal S2. Nodes A and C are formed at outputs of the NAND gates ND1 and ND2, respectively.

Inputs of the inversion means G1' and G2' are connected to the nodes A and C, respectively. Also, nodes B and D are formed at outputs of the inversion means G1' and G2', respectively.

The transistors Q12 and Q11 are connected in series between the nodes A and B and in parallel to the inversion means G1'. A gate of the transistor Q12 is connected to a drain thereof. A source of the transistor Q12 is connected to the transistor Q11. The gate and drain of the transistor Q12 are connected in common to the node A. A gate of the transistor Q11 is connected to a control signal Φ3. Also, the transistor Q11 is connected to the node B.

Similarly, the transistors Q15 and Q14 are connected in series between the nodes C and D and in parallel to the inversion means G2'. A gate of the transistor Q15 is connected to a drain thereof. A source of the transistor Q15 is connected to the transistor Q14. The gate and drain of the transistor Q15 are connected in common to the node C. A gate of the transistor Q14 is connected to the control signal Φ3. Also, the transistor Q14 is connected to the node D.

A drain of the transistor Q10 is connected to the node B and a drain of the transistor Q13 is connected to the node D. Gates of the transistors Q10 and Q13 are connected to a control signal Φ2 and sources thereof are connected to a ground voltage Vss.

The transistor Q1 has a drain connected to the power source voltage Vcc and a gate connected to the drain of the transistor Q10. The transistor Q1' has a drain connected to connected to a source of the transistor Q1, a gate connected to the drain of the transistor Q13 and a source connected to the ground voltage Vss. An output stage of the output buffer circuit is formed between the source of the transistor Q1 and the drain of the transistor Q1' in the same manner as that in FIG. 1.

The operation of the output buffer circuit with the above-mentioned construction in accordance with the present invention will hereinafter be described in detail with reference to FIG. 3 which is a timing diagram of the signals in the output buffer circuit in FIG. 2.

The two input signals S1 and S2 have the opposite phases. The control signals Φ2 and Φ3 are "high" when the control signal Φ1 is "low". Also, the control signal Φ3 goes "high" after the control signal Φ2 becomes "low".

First, in the case where the output buffer circuit is at its OFF state, low voltages appear at the nodes B and D due to no current flow through the transistors Q1 and Q1'. At this time, the input signal S1 is "high", whereas the input signal S2 is "low". The output signal becomes "high" as the control signal Φ1 becomes "high" in the middle of application of the input signals S1 and S2. If the control signal Φ2 goes "high" before the control signal Φ1 becomes "high", the transistors Q10 and Q13 are turned on and the voltages at the nodes B and D become "low". As a result, the transistors Φ1 and Q1' are turned off, resulting in flow of no unnecessary current. Then, the transistors Q11 and Q14 ape turned on when the control signal Φ3 again goes "high" after the control signal Φ2 becomes "low".

Figure 3:
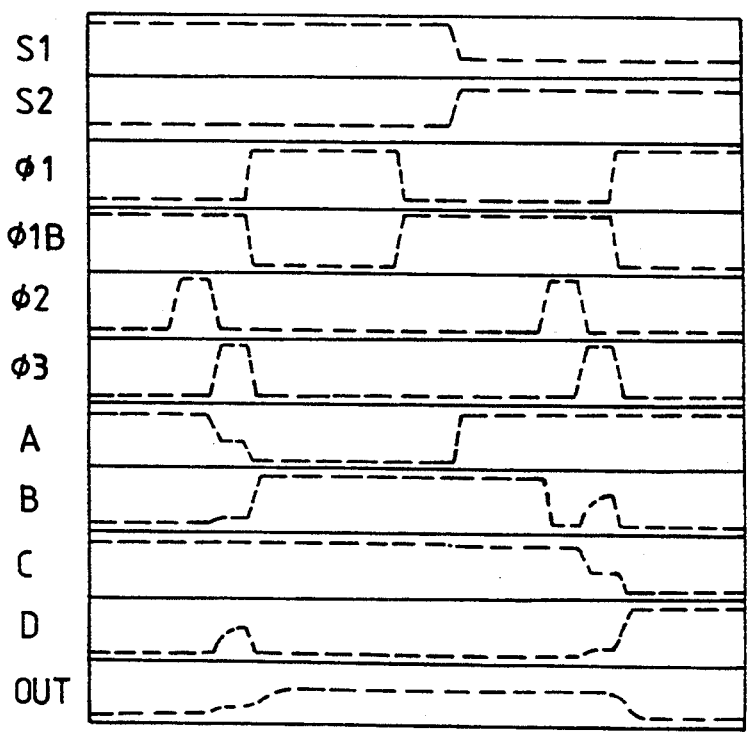
FIG. 3 is a timing diagram of signals in the output buffer circuit in FIG. 2.

As shown in FIG. 3, when the control signal Φ3 becomes "high", the voltage at the node A falls from its "high" state to its intermediate level and the voltage at the node B rises from its "low" state to its level capable of turning on the transistor Q1. Similarly, the voltage at the node D rises from its low state to its intermediate level. As a result, both the transistors Q1 and Q1' are turned on before the control signal Φ1 becomes "high", thereby causing the output signal of the output buffer circuit to rise from its low level to its intermediate level. Then, the output signal of the output buffer circuit goes from its intermediate state to its "high" state as the control signal Φ1 becomes "high".

On the contrary, in the case where the input signal S1 is "low", whereas the input signal S2 is "high", the output signal of the output buffer circuit falls from its "high" state to its intermediate level according to the control signals Φ2 and Φ3 and then falls completely from its intermediate level to its "low" state according to the control signal Φ1, in a similar manner to that mentioned above.

Figure 4:
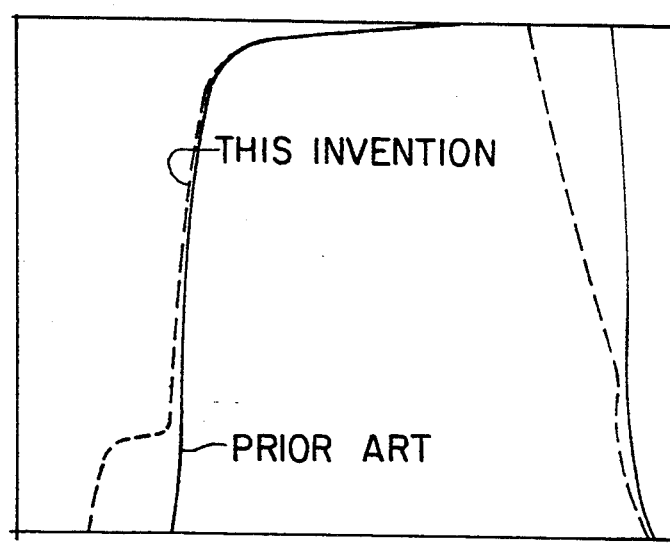
FIG. 4 is a waveform diagram of output signals from the output buffer circuits in accordance with the present invention and the prior art.

FIG. 4 is a waveform diagram of the output signals from the output buffer circuits in accordance with the present invention and the prior art. In this drawing, a solid line designates a waveform of the output signal of the conventional output buffer circuit and a dotted line designates a waveform of the output signal of the output buffer circuit according to the present invention. As seen from this drawing, the signal from the output buffer circuit according to the present invention is outputted much faster than that from the conventional output buffer circuit under the same input condition.

Figure 6:
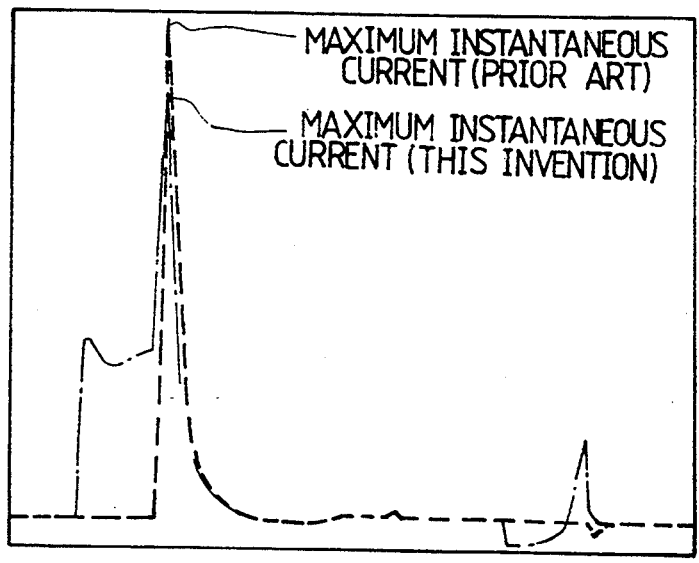
FIG. 6 is a waveform diagram of maximum instantaneous currents in the output buffer circuits in accordance with the present invention and the prior art.

FIG. 6 is a waveform diagram of the maximum instantaneous currents in the output buffer circuits in accordance with the present invention and the prior art. In this drawing, a dashed line designates a waveform of the maximum instantaneous current in the output buffer circuit according to the present invention and a dotted line designates a waveform of the maximum instantaneous current in the conventional output buffer circuit. As seen from this drawing, when the output buffer circuit of the present invention is operated, the current flowing through the circuit is increased in amount, whereas the maximum instantaneous current is reduced in amount.

Figure 5:
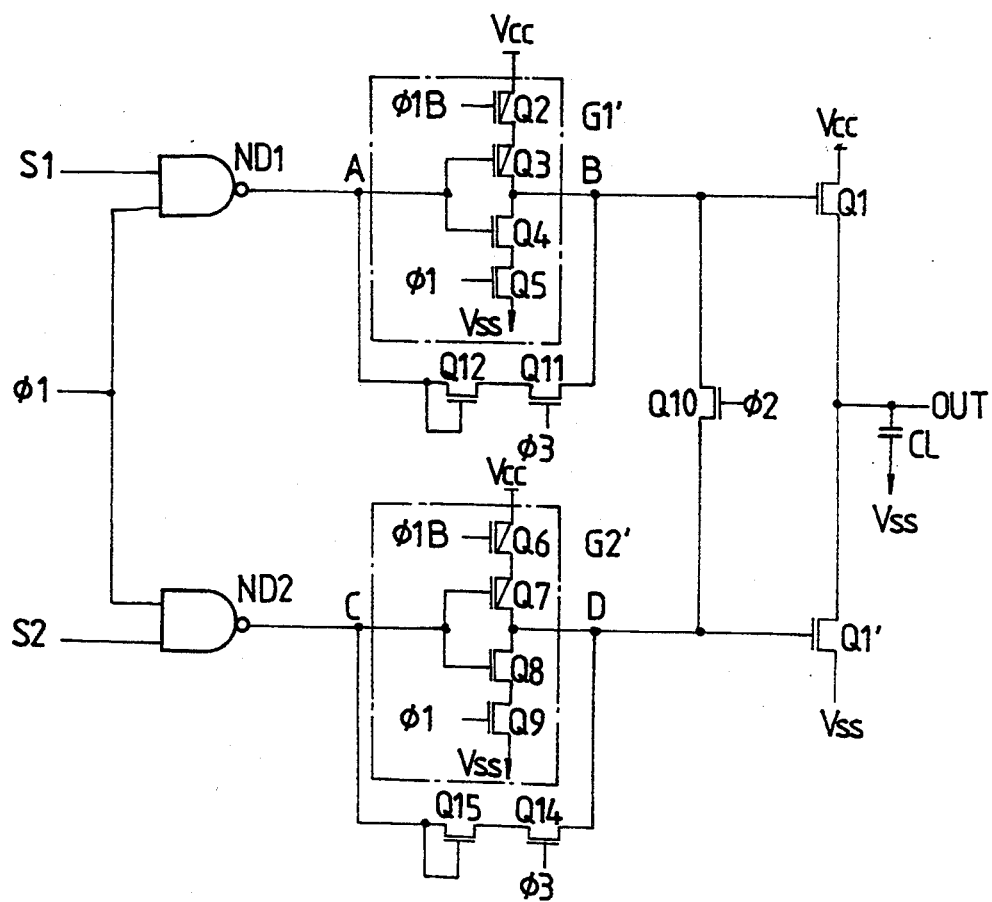
FIG. 5 is a circuit diagram of an output buffer circuit in accordance with an alternative embodiment of the present invention.

Referring to FIG. 5, there is shown a circuit diagram of an output buffer circuit in accordance with an alternative embodiment of the present invention. The construction of this drawing is substantially the same as that of FIG. 2, with the exception that only one (for example, Q10) of the transistors Q10 and Q13 in FIG. 2 is used in accordance with the alternative embodiment of the present invention. In the alternative embodiment of the present invention, the transistor Q10 is connected between the nodes B and D.

In FIG. 2, the drains of the transistors Q10 and Q13 are connected to the nodes B and D, respectively, and the sources thereof are connected to the ground voltage Vss. But, in FIG. 5, in view of the fact that the input signals S1 and S2 have the opposite phases and one of the voltages at the nodes B and D is "low", the transistor Q10 is connected between the nodes B and D. As a result, in FIG. 5, the voltages at the nodes B and D become their intermediate levels as the control signal Φ2 becomes "high". Except this point, the operation of the construction of FIG. 5 is the same as that of FIG. 2.

As apparent from the above description, according to the present invention, the two control signals are provided in addition to the single control signal of the conventional output buffer circuit. In the conventional output buffer circuit, the large amount of maximum instantaneous current flows upon the phase inversion of the output signal because the single control signal affects the output signal. This results in the generation of the noise. However, according to the present invention, the maximum instantaneous current is reduced in amount because the output voltage becomes its intermediate level before its phase inversion under the influence of the additional two control signals. This has the effect of stabilizing the output buffer circuit and enhancing the access time. In the case where the output buffer circuit of the present invention is applied to the integrated circuit, the maximum instantaneous current is reduced in amount and the data access time is thus enhanced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An output buffer circuit for an integrated circuit comprising first and second NANDing means, said first NANDing means having a first input terminal for inputting a first input signal and a second input terminal for inputting a first control signal, said second NANDing means having a first input terminal for inputting a second input signal and a second input terminal for inputting said first control signal, said first and second input signals having the opposite phases, and first and second output drive transistors coupled to provide an output, wherein the improvement comprises:

first inversion means connected to an output terminal of said first NANDing means for inverting an output signal from said first NANDing means in response to said first control signal and a second control signal, said second control signal being an inverted one of said first control signal;

second inversion means connected to an output terminal of said second NANDing means for inverting an output signal from said second NANDing means in response to said first and second control signals;

a third transistor connected to a first node, said first node connecting said first inversion means to said first output drive transistor, said third transistor having a gate connected to a third control signal, said third control signal going "high" under the condition that said first control signal is "low", to cause the output signal from said first NANDing means to become "low";

a fourth transistor having a source connected to said third transistor and a gate and a drain connected in common to the output terminal of said first NANDing means;

a fifth transistor having a drain connected to said first node, a source connected to a ground voltage and a gate connected to a fourth control signal, said fourth control signal going "high" earlier than said third control signal under the condition that said first control signal is "low", to cause output signals from said first and second inversion means to become "low";

a sixth transistor connected to a second node, said second node connecting said second inversion means to said second output drive transistor, said sixth transistor having a gate connected to said third control signal;

a seventh transistor having a source connected to said sixth transistor and a gate and a drain connected in common to the output terminal of said second NANDing means; and an eighth transistor having a drain connected to said second node, a source connected to the ground voltage and a gate connected to said fourth control signal.

2. An output buffer circuit for an integrated circuit as set forth in claim 1, wherein said first inversion means includes:

a ninth transistor having a gate connected to the output terminal of said first NANDing means and a source connected to a gate of said first output drive transistor;

a tenth transistor having a gate connected to the output terminal of said first NANDing means and a drain connected to the gate of said first output drive transistor;

an eleventh transistor having a drain connected to a source of said tenth transistor, a source connected to the ground voltage and a gate connected to said first control signal; and a twelfth transistor having a source connected to a drain of said ninth transistor, a gate connected to said second control signal and a drain connected to a power source voltage; and wherein said second inversion means includes:

a thirteenth transistor having a gate connected to the output terminal of said second NANDing means and a source connected to a gate of said second output drive transistor;

a fourteenth transistor having a gate connected to the output terminal of said second NANDing means and a drain connected to the gate of said second output drive transistor;

a fifteenth transistor having a drain connected to a source of said fourteenth transistor, a source connected to the ground voltage and a gate connected to said first control signal; and a sixteenth transistor having a source connected to a drain of said thirteenth transistor, a gate connected to said second control signal and a drain connected to the power source voltage.

3. An output buffer circuit for an integrated circuit comprising first and second NANDing means, said first NANDing means having a first input terminal for inputting a first input signal and a second input terminal for inputting a first control signal, said second NANDing means having a first input terminal for inputting a second input signal and a second input terminal for inputting said first control signal, said first and second input signals having the opposite phases, and first and second output drive transistors coupled to provide an output, wherein the improvement comprises:

first inversion means connected to an output terminal of said first NANDing means for inverting an output signal from said first NANDing means in response to said first control signal and a second control signal, said second control signal being an inverted one of said first control signal;

second inversion means connected to an output terminal of said second NANDing means for inverting an output signal from said second NANDing means in response to said first and second control signals;

a third transistor connected to a first node, said first node connecting said first inversion means to said first output drive transistor, said third transistor having a gate connected to a third control signal, said third control signal going "high" under the condition that said first control signal is "low", to cause the output signal from said first NANDing means to become "low";

a fourth transistor having a source connected to said third transistor and a gate and a drain connected in common to the output terminal of said first NANDing means;

a fifth transistor having a drain connected to said first node, a source connected to a gate of said second output drive transistor and a gate connected to a fourth control signal, said fourth control signal going "high" earlier than said third control signal under the condition that said first control signal is "low", to cause output signals from said first and second inversion means to become "low";

a sixth transistor connected to a second node, said second node connecting said second inversion means to said second output drive transistor, said sixth transistor having a gate connected to said third control signal; and a seventh transistor having a source connected to said sixth transistor and a gate and a drain connected in common to the output terminal of said second NANDing means.

4. An output buffer circuit for an integrated circuit as set forth in claim 3, wherein said first inversion means includes:

an eighth transistor having a gate connected to the output terminal of said first NANDing means and a source connected to a gate of said first output drive transistor;

a ninth transistor having a gate connected to the output terminal of said first NANDing means and a drain connected to the gate of said first output drive transistor;

a tenth transistor having a drain connected to a source of said ninth transistor, a source connected to the ground voltage and a gate connected to said first control signal; and an eleventh transistor having a source connected to a drain of said eighth transistor, a gate connected to said second control signal and a drain connected to a power source voltage; and wherein said second inversion means includes:

a twelfth transistor having a gate connected to the output terminal of said second NANDing means and a source connected to a gate of said second output drive transistor;

a thirteenth transistor having a gate connected to the output terminal of said second NANDing means and a drain connected to the gate of said second output drive transistor;

a fourteenth transistor having a drain connected to a source of said thirteenth transistor, a source connected to the ground voltage and a gate connected to said first control signal; and a fifteenth transistor having a source connected to a drain of said twelfth transistor, a gate connected to said second control signal and a drain connected to the power source voltage.

* * * * *